US010453931B2

(12) United States Patent
Blank et al.

(10) Patent No.: US 10,453,931 B2
(45) Date of Patent: Oct. 22, 2019

(54) SEMICONDUCTOR DEVICE HAVING TERMINATION TRENCH

(71) Applicant: Infineon Technologies Austria AG, Villach (AT)

(72) Inventors: Oliver Blank, Villach (AT); Franz Hirler, Isen (DE); Ralf Siemieniec, Villach (AT); Li Juin Yip, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/185,727

(22) Filed: Nov. 9, 2018

(65) Prior Publication Data

US 2019/0097005 A1 Mar. 28, 2019

Related U.S. Application Data

(60) Continuation of application No. 15/868,709, filed on Jan. 11, 2018, now Pat. No. 10,164,025, which is a
(Continued)

(30) Foreign Application Priority Data

Aug. 28, 2014 (DE) .................. 10 2014 112 338

(51) Int. Cl.
| | |
|---|---|
| *H01L 29/76* | (2006.01) |
| *H01L 29/40* | (2006.01) |
| *H01L 29/66* | (2006.01) |
| *H01L 29/423* | (2006.01) |
| *H01L 29/06* | (2006.01) |

(Continued)

(52) U.S. Cl.
CPC ........ *H01L 29/407* (2013.01); *H01L 29/0692* (2013.01); *H01L 29/0696* (2013.01); *H01L 29/4236* (2013.01); *H01L 29/66734* (2013.01); *H01L 29/7397* (2013.01);
(Continued)

(58) Field of Classification Search
CPC .............. H01L 29/7811; H01L 29/407; H01L 29/7813; H01L 29/0696; H01L 29/404; H01L 29/0638; H01L 29/0878; H01L 29/66734; H01L 29/4236; H01L 29/7397;
(Continued)

(56) References Cited

U.S. PATENT DOCUMENTS

| | | | |
|---|---|---|---|
| 5,424,231 A | 6/1995 | Yang | |
| 5,442,214 A | 8/1995 | Yang | |

(Continued)

FOREIGN PATENT DOCUMENTS

| | | |
|---|---|---|
| CN | 102856380 A | 1/2013 |
| DE | 10038177 A1 | 2/2002 |

(Continued)

*Primary Examiner* — Shouxiang Hu
(74) *Attorney, Agent, or Firm* — Slater Matsil, LLP

(57) ABSTRACT

A semiconductor device comprises a semiconductor substrate structure comprising a cell region and an edge termination region surrounding the cell region. Further it comprises a plurality of needle-shaped cell trenches within the cell region reaching from a surface of the semiconductor substrate structure into the substrate structure and an edge termination trench within the edge termination region surrounding the cell region at the surface of the semiconductor substrate structure.

20 Claims, 8 Drawing Sheets

Related U.S. Application Data division of application No. 14/837,223, filed on Aug. 27, 2015, now abandoned.

(51) Int. Cl.
*H01L 29/78* (2006.01)
*H01L 29/739* (2006.01)
*H01L 29/08* (2006.01)

(52) U.S. Cl.
CPC ...... *H01L 29/7811* (2013.01); *H01L 29/7813* (2013.01); *H01L 29/0878* (2013.01)

(58) Field of Classification Search
CPC ............... H01L 29/402; H01L 29/0634; H01L 29/7802; H01L 29/4238
See application file for complete search history.

(56) References Cited

U.S. PATENT DOCUMENTS

| | | |
|---|---|---|
| 5,488,236 A | 1/1996 | Baliga et al. |
| 5,929,481 A | 7/1999 | Hshieh et al. |
| 5,998,833 A | 12/1999 | Baliga |
| 6,194,741 B1 | 2/2001 | Kinzer et al. |
| 6,570,185 B1 | 5/2003 | Tan |
| 7,655,975 B2 | 2/2010 | Hirler et al. |
| 7,674,678 B2 | 3/2010 | Hiller et al. |
| 8,558,308 B1 | 10/2013 | Blank et al. |
| 9,419,129 B2 | 8/2016 | Gao et al. |
| 2003/0209757 A1 | 11/2003 | Henninger et al. |
| 2008/0087952 A1 | 4/2008 | Pfirsch |
| 2009/0152624 A1 | 6/2009 | Hiller et al. |
| 2010/0140695 A1 | 6/2010 | Yedinak et al. |
| 2011/0254070 A1 | 10/2011 | Hsieh |
| 2012/0061753 A1 | 3/2012 | Nishiwaki |
| 2012/0153386 A1 | 6/2012 | Hirler et al. |
| 2012/0267704 A1 | 10/2012 | Siemieniec et al. |
| 2013/0001683 A1 | 1/2013 | Pan et al. |
| 2013/0207227 A1 | 8/2013 | Azam et al. |
| 2013/0221427 A1* | 8/2013 | Siemieniec ........... H01L 29/407 257/330 |
| 2014/0209970 A1 | 7/2014 | Schulze et al. |
| 2014/0210000 A1* | 7/2014 | Tokuda ................ H01L 29/7811 257/330 |
| 2014/0357048 A1* | 12/2014 | Meiser ................. H01L 29/407 438/424 |
| 2015/0194495 A1 | 7/2015 | Azam et al. |

FOREIGN PATENT DOCUMENTS

| | | |
|---|---|---|
| DE | 112004002608 T5 | 11/2006 |
| JP | 2002110984 A | 4/2002 |
| KR | 100418972 B1 | 2/2004 |
| KR | 20040033312 | 4/2004 |

* cited by examiner

Forming a semiconductor device having a trench arrangement within a cell and edge termination region.

SEMICONDUCTOR DEVICE HAVING TERMINATION TRENCH

This application is a continuation of U.S. application Ser. No. 15/868,709, filed on Jan. 11, 2018, which application is a divisional of U.S. application Ser. No. 14/837,223, filed Aug. 27, 2015, which application claims the benefit of German Application No. 102014112338.7, filed Aug. 28, 2014, which applications are hereby incorporated herein by reference.

TECHNICAL FIELD

Embodiments relate to measures for increasing the breakthrough strength or reducing the on resistance of semiconductor devices and in particular to a semiconductor device and a method for manufacturing a semiconductor device.

BACKGROUND

Many electronic devices, e.g. for applications as power switches, are desired to have a reduced area-specific on resistance, to minimize the static power dissipation. Compensation devices having an insulated field plate within a trench for charge carrier compensation have prevailed in many areas for low and medium breakdown voltages up to 300 V. Many known solutions have a stripe design. An aim of development is an optimization of this parameter, without deteriorating the switching characteristics and without increasing the production costs too much.

SUMMARY

An embodiment relates to a semiconductor device comprising a semiconductor substrate structure comprising a cell region and an edge termination region surrounding the cell region. A plurality of needle-shaped cell trenches is located within the cell region reaching from a surface of the semiconductor substrate structure into the semiconductor substrate structure and an edge termination trench is located within the edge termination region surrounding the cell region at the surface of the semiconductor substrate structure.

According to an embodiment a semiconductor device comprises a semiconductor substrate structure comprising a cell region and an edge termination region. The edge termination region surrounds the cell region. A row of needle-shaped trenches within the edge termination region surrounds the cell region at the surface of the semiconductor substrate structure. A plurality of field plate structures extend into the needle-shaped trenches of the row of needle-shaped trenches. The field plate structures are insulated from the semiconductor substrate structure within the trenches by an insulating material structure extending throughout the row of needle-shaped trenches.

According to an embodiment a semiconductor device comprises a semiconductor substrate structure comprising a cell region and an edge termination region surrounding the cell region. At least one cell trench is located within the cell region reaching from a surface of the semiconductor substrate structure into the substrate structure. At least one edge termination trench is located within the edge termination region surrounding the cell region at the surface of the semiconductor substrate structure and an insulation layer within the trenches. The insulation layer within the at least one cell trench is thinner than the insulation layer within the at least one edge termination trench.

BRIEF DESCRIPTION OF THE DRAWINGS

Some embodiments of apparatuses and/or methods will be described in the following by way of example only, and with reference to the accompanying figures, in which:

FIG. 3b shows the field strength distribution for the structure of FIG. 3a;

FIG. 3c shows the breakthrough characteristic of the structure in FIG. 3a,

FIG. 4b shows the field strength distribution for the structure of FIG. 4a;

FIG. 4c shows the breakthrough characteristic of the structure in FIG. 4a;

FIG. 8 shows a flow chart of a method for forming a semiconductor device.

DETAILED DESCRIPTION OF ILLUSTRATIVE EMBODIMENTS

Various example embodiments will now be described more fully with reference to the ac-companying drawings in which some example embodiments are illustrated. In the figures, the thicknesses of lines, layers and/or regions may be exaggerated for clarity.

Accordingly, while further embodiments are capable of various modifications and alternative forms, some example embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of further example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
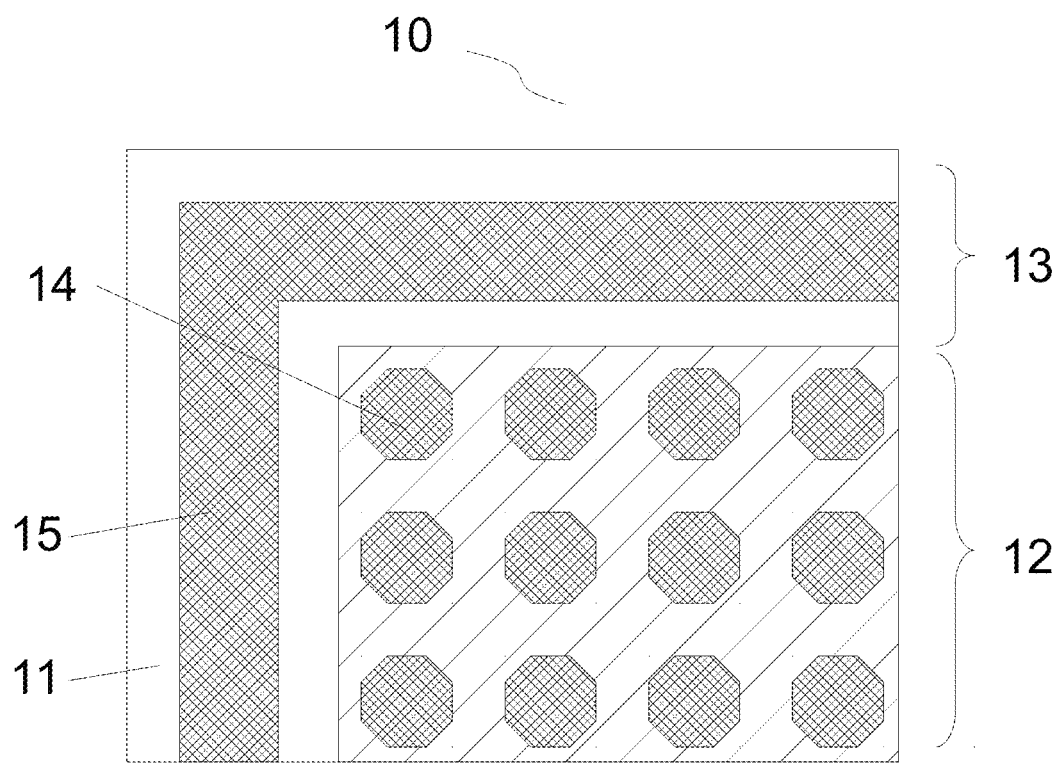
FIG. 1 shows a top view of a corner section of a semiconductor device with an edge termination structure.

FIG. 1 shows a corner part of a semiconductor device 10 in top view on the surface, having a semiconductor substrate structure 11, a cell region 12 (hatched) and an edge termination region 13, a plurality of needle-shaped trenches 14 (exemplary for all others) and an edge termination trench 15.

According to an embodiment a semiconductor device 10 comprises a semiconductor substrate structure 11 comprising a cell region 12 and an edge termination region 13 surrounding the cell region 12, a plurality of needle-shaped cell trenches 14 within the cell region 12 reaching from a surface of the semiconductor substrate structure 11 into the semiconductor substrate structure 11 and an edge termination trench 15 within the edge termination region 13 surrounding the cell region 12 at the surface of the semiconductor substrate structure 11.

By implementing measures to build a suitable edge termination structure, the breakthrough strength may be increased and the on resistance may be reduced.

The semiconductor device 10 may be implemented by any semiconductor processing technology capable of forming the trenches for the cell and edge termination region, for example. In other words, the semiconductor device 10 may be a silicon-based semiconductor structure, a silicon carbide-based semiconductor structure, a gallium arsenide-based semiconductor structure or a gallium nitride-based semiconductor structure, for example.

A semiconductor device 10 may comprise mainly or only the trench arrangement or may comprise further electrical elements or circuits (e.g. control unit for controlling the trench arrangement or a power supply unit).

The trench arrangement comprises a plurality of trench structures distributed over the cell region 12 and the edge termination region 13. Further, trench structures, for example of the plurality of needle-shaped trenches may comprise transistor structures, for example field-effect transistor structures. These transistor structures may each comprise a source area, a drift area, a body area, a source area and/or a gate or at least a part of the trenches (or all) share a common drain layer and/or a common drift layer, but may comprise separate body areas, source areas and gates, for example.

The semiconductor substrate structure 11 may be a structure comprising or consisting of semiconductor material. The semiconductor substrate structure may be an epitaxial semi-conductor substrate or a bulk substrate (e.g. part of a semiconductor wafer) or may comprise an epitaxial semiconductor layer formed on a bulk substrate, for example. The epitaxial semiconductor substrate may comprise a significantly lower doping concentration than the bulk substrate (e.g. less than 10 times or less than 100 times). The semiconductor substrate structure 11 may be a silicon based semiconductor substrate structure, a silicon carbide based semiconductor substrate structure or a gallium arsenide based semiconductor substrate structure, for example.

A top view of the semiconductor device 10 may be a view from a point of view located above a (main) surface of the semiconductor device 10.

A main surface (short: surface) of the semiconductor device 10 may be a semiconductor surface of the device towards metal layers, insulation layers or passivation layers on top of the semiconductor surface. In comparison to a basically vertical edge (e.g. resulting from separating the semiconductor dies from others) of the semiconductor structure, the main surface of the semiconductor structure may be a basically horizontal surface extending laterally. The main surface of the semiconductor structure may be a basically even plane (e.g. neglecting unevenness of the semiconductor structure due to the manufacturing process and trenches). In other words, the main surface of the semiconductor device 10 may be the interface between the semiconductor material and an insulation layer, metal layer or passivation layer on top of the semiconductor substrate structure.

In other words, a lateral direction or lateral expansion may be oriented basically in parallel to the main surface and a vertical direction or vertical expansion may be oriented basically orthogonal to the main surface.

Trenches reaching or extending from the surface into the substrate structure may be etched and may extend vertically into the depth of the substrate structure to a bottom point. The trenches usually also have a lateral extension defined e.g. by the lithography mask and the following etching process. This geometrical description of trenches extending into the substrate structure also includes other production methods.

A needle-shaped trench may be a trench comprising in one lateral direction a similar extension (e.g. less than 5 times, less than 3 times, less than 2 times) than in another (e.g. orthogonal) lateral direction.

A strip-shaped trench may be a trench comprising in one lateral direction a significantly larger extension (e.g. more than 5 times, more than 10 times or more than 100 times) than in another (e.g. orthogonal) lateral direction.

There are at least two regions, first a cell region which contains an array of cells or cell field, whereas a cell of the cell region may comprise an active cell having a transistor structure to perform a basic purpose of the semiconductor device. Each cell may have one trench for controlling a channel of the transistor structure and/or charge carrier compensation. The trenches within the cell region may be at least mainly (e.g. more than 50%, more than 70%, more than 90% of the trenches or all trenches) needle-shaped. There may be hybrid cell forms, like a mixture of active needle-shaped and strip-shaped trenches even within the cell region.

The edge termination region may serve as an electrical barrier to the outside of the active cell region (towards the edge of the semiconductor substrate structure). It may cause a prolongation of a current path from the active cell field to the margin of the semiconductor device. A breakthrough or flow of current on this path would be undesirable. The edge termination region may also be called peripheral-, margin-, rim- and edge-region.

The existence of suitable edge termination structures may provide a high breakthrough voltage for the semiconductor device and may prolong the lifetime and reliability of the component.

The on resistance (or on-state resistance or switching-on resistance) may be the resistance which the current encounters, when flowing in the switched on state of the semiconductor device. The resistance may be area-specific, e.g. be lower in the cell field or middle of the cell field, than at the edge.

Except in the range of very low breakdown voltages (<30 V) where the resistance depends mainly on the part of the channel, the on resistance for described devices may be mainly dominated by the contribution of the drift region (e.g. Mesa). In order to achieve a further significant reduction of the area-specific on resistance, the transition from a stripe to a cell design represents a possibility, for example. In this way the silicon cross-section can be increased and thus, the contribution of the drift region to the overall on resistance can be further reduced, despite simultaneous compensation. In order to use such cell structures in devices, even more appropriate edge termination structures may be required.

Edge termination structures for devices having field-plate structures within the trenches for compensation may be implemented by providing a trench as a boundary around the cell field. This trench may be closed, i.e. without a gap. The trench may be called closed, if it surrounds a cell region viewed from the top in a two dimensional projection. It does not necessarily have to surround it everywhere, like the 5th and 6th side of a cube would surround the cell region in a tree dimensional way. Of course the closed edge termination trench (without a gap) may surround the cell region in a three dimensional way on the lateral side around the cell region (two dimensions) and in the third dimension from the surface down to the bottom of the edge termination trench. E.g. the edge termination trench may surround the whole lateral side of the cell region, which may be realized by extending the edge termination trench from the surface to at least the depth of the cell trenches, for example. In other words, for example, the edge termination trench may be circumferential, surrounding or circled.

In the drift region undesired free charge carriers may reside, which may undesirably reduce the breakthrough strength. An adjacent trench having an insulated field-plate structure on a specific potential (like source, gate or the potential, of an adjacent semiconducting area) may help to reduce or bind these free charge carriers, thus increasing the breakthrough strength, while having the same or similar on resistance.

A mesa region is the semiconductor area located lateral between the trenches. It may also comprise the drift region or a part of the drift region (e.g. with the charge carriers flowing in a vertical direction). Due to the doping of the mesa region free charge carriers are available here. If these can be bounded, e.g. by the compensation field-plate structure arrangement, a higher doping of the mesa/drift region can be realized in relation, than without compensation field-plate structures and thus a lower on resistance may be achieved while having the breakthrough voltage remaining the same or even increasing.

In larger mesa regions more doping or free charge carriers caused by doping may be necessary to be resolved. Especially in transition from the cell region to the edge termination region, larger distances between trenches may exist, e.g. on a diagonal direction from a cell trench to the corner part of a surrounding edge termination trench. Due to existing diagonals in contrast to the cell region, the integrated charge along the diagonal may larger than the integrated charge along the orthogonal direction. In consequence, both areas may have different breakdown voltages, which can cause problems in case of a large deviation.

In addition, open designs, in which the peripheral edge of the trench is omitted or designs with many circulating closed peripheral edge trenches may be used.

In an embodiment of the semiconductor device, a field plate structure may extend inside at least one trench and the field plate is insulated from the semiconductor substrate structure by an insulation layer within the trench.

A field plate structure may be a conducting structural element, e.g. material in a certain shape, which reaches out or extends inside a trench and has the effect of a field plate. Its shape needs not necessarily to be a plate shape, but it can be. The shape of the field plate structure may be similar to that of the according trench.

For example, a field plate structure may extend inside each trench of the plurality of needle-shaped cell trenches and the edge termination trench. Further, the field plate structures may be insulated from the semiconductor substrate structure within the trenches by an insulation layer. For example, the insulation layer within the plurality of needle-shaped cell trenches is thinner than the insulation layer within the edge termination trench. For example, a field plate structure within the edge termination trench may comprise a smaller vertical extension (e.g. measured from the surface of the semiconductor substrate structure vertically into the semiconductor substrate structure) than the field plate structures within the plurality of needle-shaped cell trenches.

In an aspect a predefined voltage is applied to the field plate inside the trench to force a charge carrier compensation.

In an aspect the field plate is connected to source or an intermediate potential, whereas the intermediate potential may be the potential of the semiconductor substrate structure adjacent to an inactive trench.

An inactive trench may be a trench which does not comprise a gate structure or is not connected to a gate potential and or the source implant is left out or is not connected to a source potential.

In an aspect the insulation layer within the trenches comprises or is made of an oxide as material. This oxide may serve as a field oxide.

In an aspect the insulation layer has a thickness between 1% and 40% of the minimal or maximal lateral extension of the trench or thickness of the trench. For example the thickness of the insulation layer may be between 0.1 μm and 4.5 μm, between 0.5 μm and 3 μm between 0.7 μm and 0.9 μm or 0.7 μm and 1.5 μm. The thickness may be alternatively 0.75 μm or 0.85 μm or 1.0 μm. The insulator thickness may be selected depending on the targeted breakdown voltage.

In an embodiment of the semiconductor device, the edge termination trench is completely filled with insulating material.

This may include the inclusion of air or air bubbles, which may e.g. occur due to the manufacturing process. For example, the desired effect may occur without a field-plate structure, so a possible production method may be used by only filling insulation material into the trenches.

In an aspect the edge termination trench extends into the substrate structure to a depth between 2 and 20 times of a minimal or maximal lateral extension or thickness of the edge termination trench. For example the trench may extend between 4.5 µm and 6.0 µm into the substrate structure. The depth may alternatively be 5.0 µm or 5.5 µm.

In an aspect the insulation layer inside the edge termination trench is thicker at least at one position further away from the surface than at another position which is closer to the surface. To deal with peaks of the field strength, which occur often at the bottom part of the trench, it may be suitable to thicken the insulation layer at this point. Thus the thickness at the bottom part (which is located deeper inside the substrate structure, i.e. further away from the surface) may be bigger than at the top part which is close to the surface. Different arrangements may be possible, e.g. a certain thickness at the top part, changing via a step to a second thickness at the bottom part. Another arrangement could be a continuous increase of the thickness from the surface to the bottom.

For example, in this case the trench has (approximately) the same width throughout the whole extension, the field plate structure would have to get smaller accordingly to where the thickness of the insulation layer increases.

In an aspect a field stop layer exists between a drift zone of one conductivity type doping within the semiconductor substrate structure and a higher doped area of the same conductivity type within the substrate structure (e.g. backside drain contact region of a vertical field effect transistor) or a higher doped area of the opposite conductivity type within the substrate structure (e.g. backside collector region of an insulated gate bipolar transistor). The drift zone may have a low doping, while the backside contact region has a high doping. A field stop layer may be situated in between and has a doping which is between the adjacent zones.

Further a drain layer may be applied at the backside.

In an embodiment of the semiconductor device, the trenches of the plurality of needle-shaped cell trench are active needle-shaped cell trenches comprising gate structures for controlling adjacent channels of field effect transistor structures.

In an aspect the field effect transistor structure suits for the needs of a MOSFET (metal oxide semiconductor field effect transistor), Power-MOSFET or IGBT (insulated gate bipolar transistor). These may be devices which are desired to have a low on resistance and/or a high breakthrough voltage, which may be supported by the proposed arrangement of the edge termination trench.

In an aspect the edge termination trench surrounds the array of cells without a gap. While it is imaginable in general that a surrounding edge trench comprises gaps in between, this aspect proposes to have a closed surrounding gap. This may assure that the field strength leading to the outside of the device structure is reduced laterally at every place around the cell region.

For example, a semiconductor structure within a semiconductor device having a semiconductor substrate structure, at least one surface and trenches, which extend from the surface into the substrate structure, may comprise an array of cells. At least one cell comprises a needle-shaped cell trench and an edge termination trench structure positioned out-side/around the array of cells with at least one strip-shaped edge termination trench. The semiconductor structure may be processed on a semiconductor substrate structure, which is a layer of a solid substance, which serves as base or foundation for the applying of other materials (e.g. doping) for the structure. The material of the semiconductor substrate structure may be one out of the selection from the materials for the semiconductor structures. A wafer may be a suitable semiconductor substrate structure.

In an aspect a needle-shaped trench comprises a lateral extension in one direction of less than 2 times the extension in the orthogonal direction.

Figures 2A, 2B:
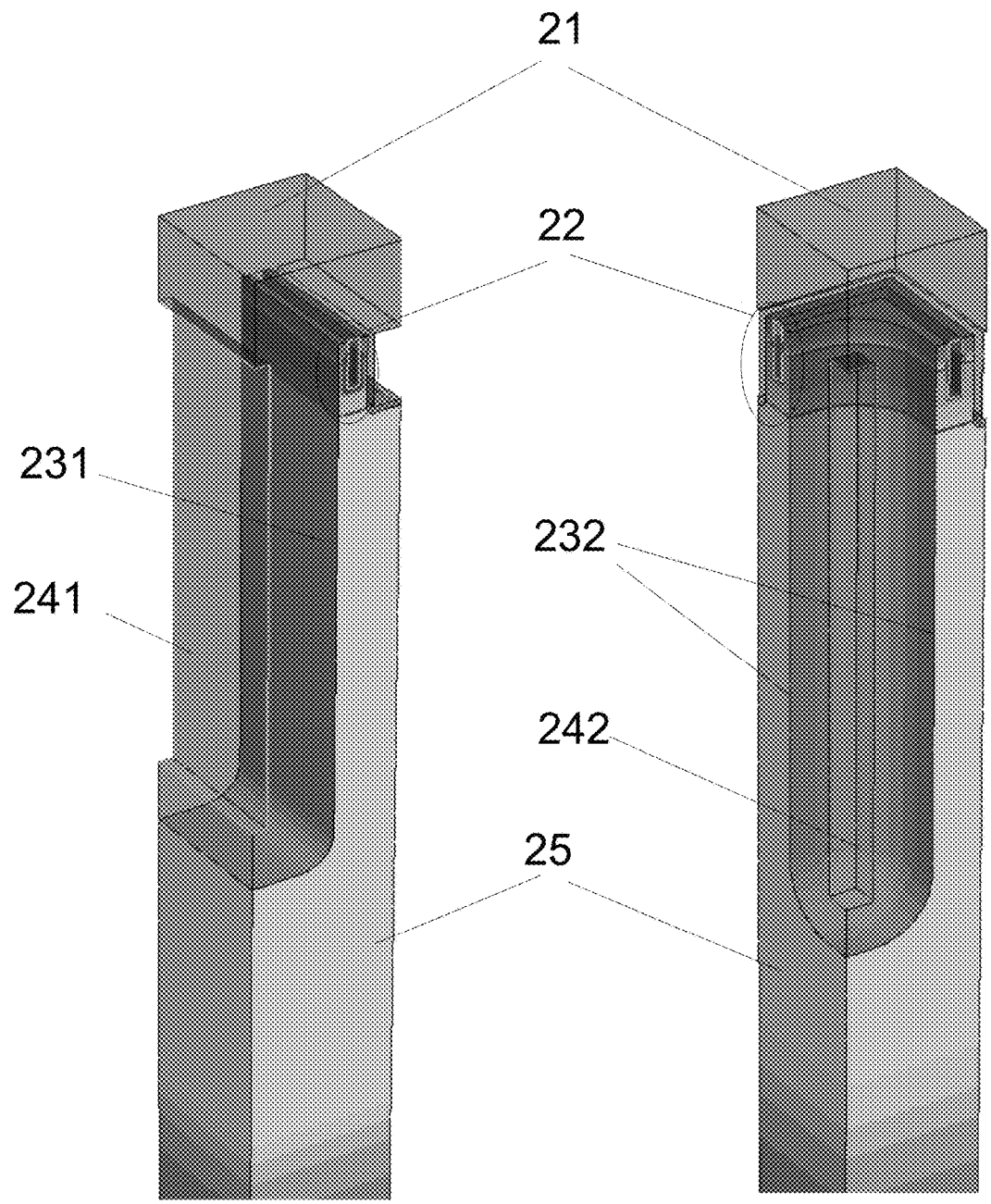
FIG. 2a shows a vertical cross section of a strip-shaped trench reaching into a semiconductor substrate structure.
FIG. 2b shows a vertical cross section of a needle-shaped trench reaching into a semiconductor substrate structure.

FIG. 2b shows a cross-cut section of a needle-shaped trench, which extends vertically into a substrate structure 25, forming an outline 232 between the trench and the substrate structure. This outline may be curved/round in a lateral direction of the trench. Further the trench may comprise a field plate structure 242, which may have a needle-shaped form, too. Optionally, the shape of the field plate structure may be the same like the shape of the needle-shaped trench (e.g. both are round). Otherwise they can be different, too (e.g. a round trench and a square field plate shape).

The needle-shaped trenches may—independently of their shape—comprise an insulation 21 reaching into the trench and a transistor structure 22 may formed by the trenches and the adjacent part of the semiconductor substrate structure, which includes accordingly doped regions.

Needle-shaped trenches may appear as needles pinching into the surface usually orthogonal to the surface. The shape in view from above may be round, oval, square, hexagonal or polygonal. The needle-shaped trench extends deeper into the substrate structure than its width (lateral extension), for example.

In an embodiment of the semiconductor device, the needle-shaped trench comprises a maximal lateral extension in one direction of less than 2 times a minimal lateral extension in another direction.

In an aspect the edge termination trench is a strip-shaped trench.

A strip-shaped trench may have a maximal lateral extension in one direction (along) of more than 10 times or 100 times a minimal lateral extension in another direction (across). A strip-shaped trench may be straight, straight in a middle line along the long side, at least may appear as a long structure (in view from above). The lateral walls of the strip-shaped trench may be straight (besides from production deviations) or have another shape, e.g. bended like at the bottom in FIG. 2a.

FIG. 2a shows a cross-cut section of a strip-shaped trench, which extends vertically into a substrate structure 25, forming an outline 231 between the trench and the substrate structure. This outline may be straight in the direction of the trench (to the front-right and back-left within this figure) and at least as long as described. Further the trench may comprise a field plate structure 241, which may have a strip-shaped form, too. In this case, the field plate structure is literally a field plate.

In an embodiment of the semiconductor device, the edge termination region comprises several closed strip-shaped edge termination trenches surrounding the cell region at the surface of the semiconductor substrate structure (without gaps).

To strengthen the effect of one strip-shaped edge termination trench, at least one additional trench with the same layout may be designed around the cell region. Thus two or more lateral field strength barriers may exist and/or the distance to the edge of the semiconductor device (the effective current path) may be increased.

In an aspect the needle-shaped cell trenches and the edge termination trench (e.g. regarding depth of trenches and/or distance of trenches) are designed in a way that an avalanche happens within the cell region (or array of cells). In this way, the performance of the semiconductor device may be limited by the cell region design and not the edge termination design.

In an aspect the cell region (or array of cells) comprises transistor structures, whereas the edge termination region doesn't.

Besides the surrounding edge termination trench at least one row of (inactive) needle-shaped trenches may be part of the edge termination region. A structure, like a proposed trench may be part of the edge termination region, if it does not contain a gate or source structure or connection as the trenches or cells in the cell region do, for example.

In an aspect the strip-shaped trench is the outermost trench of the edge termination region and at least one inner part of the edge termination trench region comprises a row of needle-shaped trenches.

Also needle-shaped trenches like the ones inside the cell region may contribute to an edge termination region. Instead or additional to a strip-shaped trench a row of needle-shaped trenches may be designed having the same or similar features as a strip-shaped trench. The needle-shaped trenches may have a space or distance in between or otherwise overlap so the optional insulation material is of one entity throughout the overlapping trenches.

An additional row of needle-shaped trenches may be arranged parallel to the strip-shaped trench (viewed from above), as well as several combinations of a plurality of rows of needle-shaped trenches and strip-shaped trenches. Deviations up to 20° or 10° or 5° between one (row of) trench(es) and another (row) of trench(es) within the stretch which is the most parallel, still may count as parallel.

In an aspect only one edge termination trench completely surrounds the cell region. This may include that no row of needle-shaped trenches participate to the edge termination region.

In an aspect the edge termination region comprises exactly one inner row of needle-shaped trenches located inside an outer surrounding trench structure.

In an aspect exactly two inner trench structures comprising two rows of needle-shaped trenches are located inside an outer surrounding trench structure.

The outer surrounding trench may be the described strip-shaped trench whereas one or two or more rows of needle-shaped trenches (having the features of an edge termination trench) are located to the inside. These may be surrounding, too.

In an aspect at least one edge termination trench does not comprise a field plate or comprise a field plate which is not connected (to source or source like potential).

In an aspect the outermost edge termination trench does not comprise a field plate or comprise a field plate which is not connected (to source or source like potential).

In an embodiment of the semiconductor device, the lateral distance between the outermost edge termination trench and a needle-shaped cell trench closest to the outermost edge termination trench is larger than an extension of the outermost edge termination trench from the surface of the semiconductor substrate structure into the semiconductor substrate structure.

In an aspect the lateral distance may be measured (either or in combination) at the shortest distance, between the edge termination region and cell region, from the outside of the cell region or the outermost cell trench (structure) and/or from the inside, the middle or the outside of the edge termination region or the outermost edge termination trench or trench structure (e.g. needle-shaped row of trenches).

The outside might be the center of the outermost structure (e.g. the middle of a trench) or the outside part of the outermost structure (e.g. the lateral surface of the trench facing the opposite region).

In an aspect the width of at least one (or one row or all) edge termination trench is larger than the width of the smallest, biggest or average trench or needle-shaped trench in the cell region.

In an aspect at least one edge termination trench extends less deep into the substrate structure than the plurality of cell trenches.

Alternatively, at least one edge termination trench extends deeper into the substrate structure than the plurality of cell trenches.

In an embodiment of the semiconductor device, the edge termination trench extends substantially as deep into the substrate structure as the plurality of cell trenches.

The extension (or vertical dimension) may have a deviation of 0.5 µm, 0.2 µm, 0.1 µm or 0.01 µm or a deviation of less than 10%, 5% or 1% of the depth of the (shallowest, deepest, average of the) plurality of cell trenches.

In an aspect the edge termination trench may extend (vertically) into a drain region of the substrate structure (e.g. located at a backside of the semiconductor substrate structure) which comprises a higher doping (concentration), to obtain an ohmic contact to a metal-drain electrode. For example, the edge termination trench may extend to a doping region comprising a doping concentration of more than 10 times (or more than 100 times) of a doping concentration in the drift region.

Figure 3A:
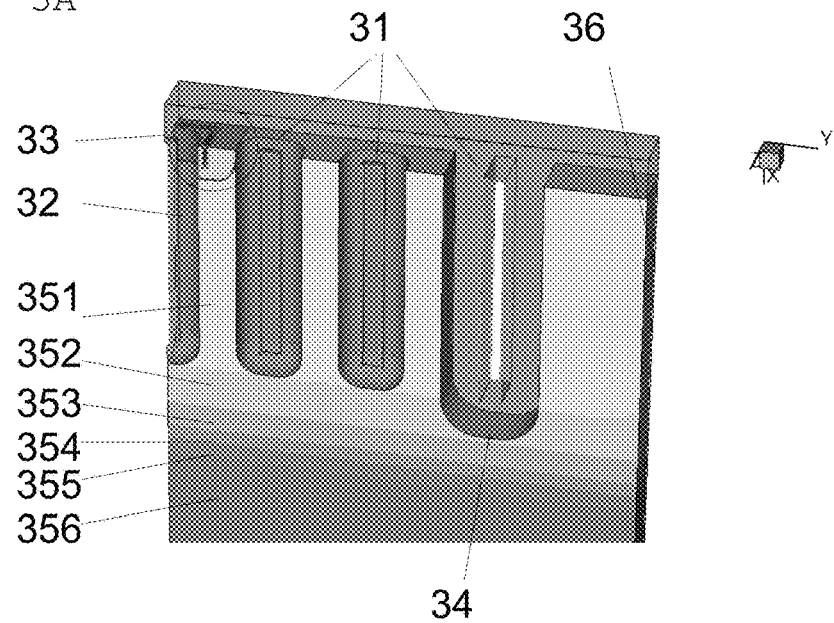
FIG. 3a shows a cross section of an edge termination structure having a thick field oxide within the edge trench.

FIG. 3a shows a vertical cross section of an edge trench structure with trenches 31, 32 extending into the substrate structure which has different doped regions 351-356. The doping concentration increases from 351 to 356, whereas the cell region trenches 32 have their bottom within a doped region 351 which is the drift region of the semiconductor structure. Cell region trenches 32 have transistor structures 33, 22, with suitable doped regions. There are 3 edge termination trenches 31 whereby the inner are needle-shaped and the outermost is a strip-shaped trench (see cross-cut). The bottom 34 of the outermost trench extends deeper into the substrate structure, than the inner trenches.

For example, the trenches in the cell field may also reach into an already higher doped zone as 352 or even being reached by the lower part of the field-stop profile extending from the substrate into the epi (epitaxial layer of the semiconductor substrate structure). However, the trench does not reach the substrate region (bulk substrate of the semiconductor substrate structure), for example. The part of the drift region having a higher doping than the initial mesa doping may still be depletable before breakdown occurs, for example.

This may be to build a stronger barrier against an undesired breakthrough to the edge 36 of the semiconductor device, which may contain strong defects due to cutting. These defects attract a current path to bring backside potential to the surface at the edge 36. The outermost edge termination trench provides a prolonged distance for a possible breakthrough path from the surface on the lateral side to the active cell region.

Figure 3B:
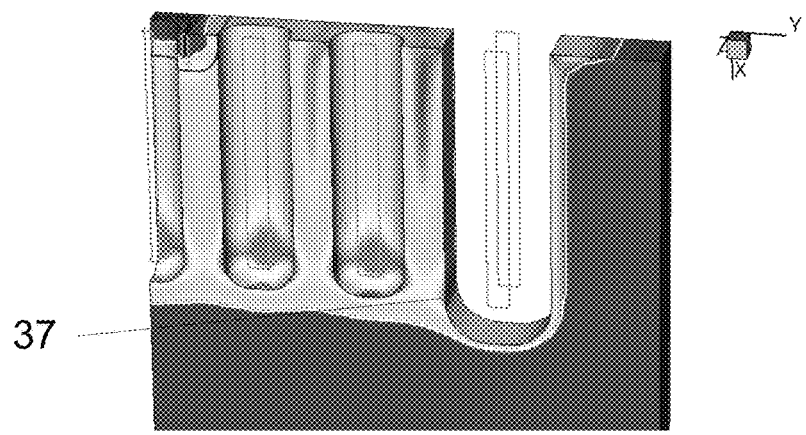

FIG. 3b shows the electric field strength at breakthrough in the structure shown in FIG. 3a. The largest field strength between the potential of the field plate and the drift region usually occurs at the bottom of the trenches, where the adjacent substrate structure has the highest doping concentrations or the insulation layer is not as big due to different forms of the trench and its field plate. The maximum field strength at the outermost edge termination trench 37 has a certain level for this arrangement with 3 edge termination trenches.

Figure 3C:
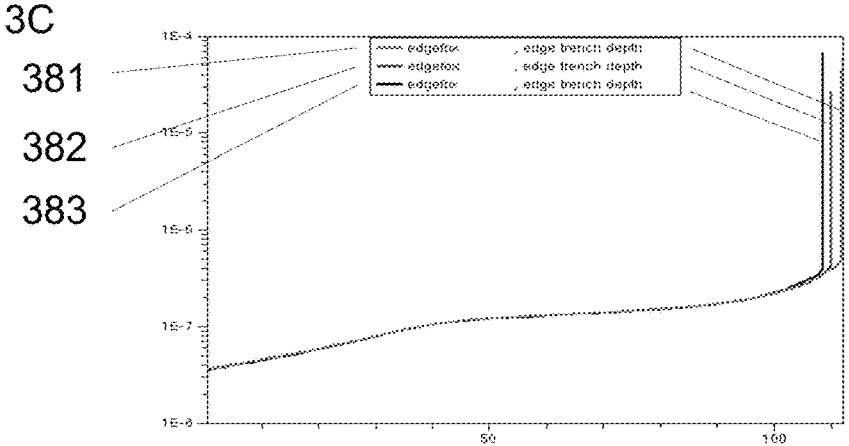

FIG. 3c shows three possible breakdown characteristic curves for two different field oxide thicknesses and two different trench depths of the outermost edge termination trench according to the arrangement of FIG. 3a. A greater field oxide thickness, as well as a shallower trench in the edge termination region may shift the breakdown voltage to higher values.

The loss of blocking strength for deeper edge trenches may be caused by the optimized doping profile including a field stop layer regarding the on resistance reduction—the deeper trench then reaches already into a higher doped region. The maximum field strength in case of the breakdown may be found in the bottom part of the needle trench. The avalanche is therefore located in the range of the cell field which may improve the avalanche resistance.

Further in FIG. 3c the x-axis depicts the applied source-drain voltage and the y-axis the current. Line 381, the line 382 and the line 383 show the characteristic lines for different field oxide thickness and different trench depths. For example, the field oxide thickness may be between 0.5 µm and 1 µm and the trench depth may be between 3 µm and 8 µm.

FIG. 4a shows again a vertical cross section of an edge trench structure with trenches 31, 32 extending into the substrate structure which has the same different doped regions 351-356. The doping concentration increases from 351 to 356, whereas the cell region trenches 32 have their bottom within a doped region 351 which is the drift region of the semiconductor structure. Cell region trenches 32 have transistor structures 33, 22, with suitable doped regions. Here are only 2 edge termination trenches 41 whereby the inner is needle-shaped and the outermost is a strip-shaped trench (see cross-cut). The bottom 44 of the outermost trench extends deeper into the substrate structure, than the inner trench but as deep as the bottom 34 of the outermost edge termination trench of FIG. 3a.

Figure 4A:
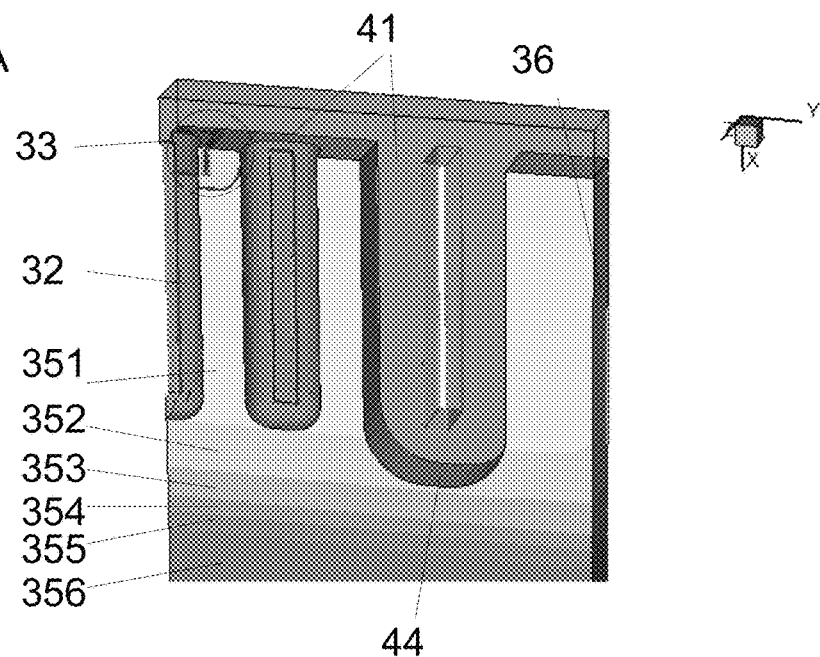
FIG. 4a shows a cross section of an edge termination structure having a thick field oxide within the edge trench and only one intermediate trench.
Figure 4B:
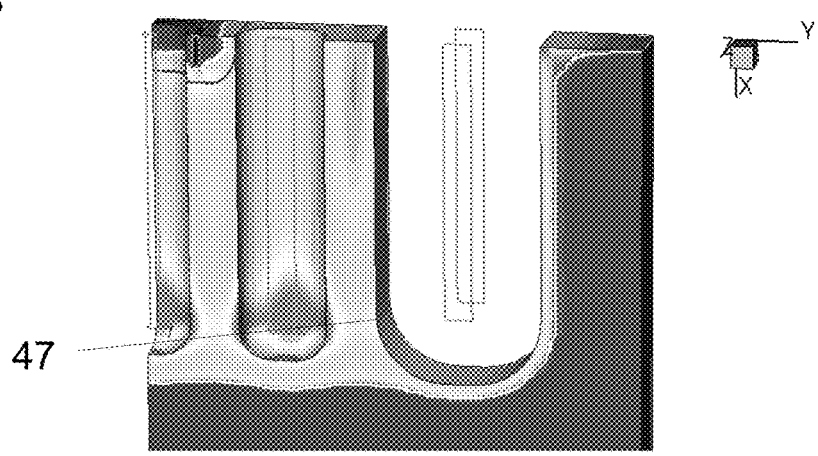

FIG. 4b shows the electric field strength at breakthrough in the structure shown in FIG. 4a. The maximum field strength at the outermost edge termination trench 47 has a lower level for this arrangement with only 2 edge termination trenches compared to the certain level for the arrangement with 3 edge termination trenches of FIG. 3b.

Figure 4C:
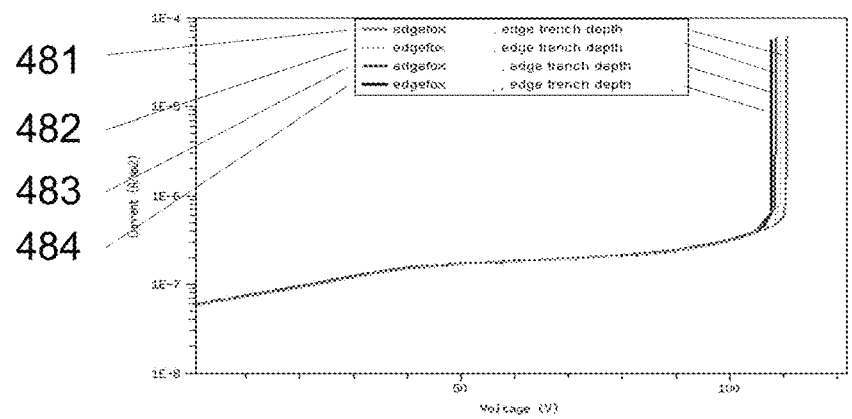

FIG. 4c shows three possible breakdown characteristic curves for different field oxide thicknesses and trench depth of the outermost edge termination trench according to the arrangement of FIG. 4a.

In other words the characteristic curve may show that in the edge termination region, the number of inactive needle-shaped trenches (the ones which have no adjacent body region) between cell field and edge termination trench can also be reduced to one trench. The field distribution in FIG. 4b on the right side 47 shows a further reduced field peak on the field oxide interface of the outermost closed edge termination trench, compared to FIG. 3b.

Further in FIG. 4c the x-axis depicts the applied source-drain voltage and the y-axis the current. Line 481, the line 482 and the line 483 show the characteristic lines for different field oxide thickness and different trench depths. For example, the field oxide thickness may be between 0.5 µm and 1 µm and the trench depth may be between 3 µm and 8 µm.

In an embodiment of the semiconductor device, the edge termination trench comprises one of a rectangular, square, round, curved, hexagonal and octagonal layout.

The outer, inner or middle line of the (surrounding) edge termination trench usually needs to change its direction at some points (top view) to surround the cell region. At least it must comprise bends or corners of 360° altogether (on a plain surface—accordingly more than this on non-plain surfaces). A possible layout is a rectangular design, which means straights (e.g. with a deviation of less than 20°, 10°, 5° or 1°) and 4 rectangular corners (e.g. with a deviation of less than 20°, 10°, 5° or 1°).

The angles may be the same for all corners. Some layouts have straights, which do not have the same length, e.g. an octagonal layout having 4 long straights and 4 short straights, while the latter are close to the corners of the cell region or semiconductor device, for example. Also the angles on the orthogonal layout may deviate slightly from its mean value (which is 45° on a plain surface). The round curved, hexagonal or octagonal shaped line of the layout may occur at the inside, the outside or the middle of the edge termination trench.

In an embodiment of the semiconductor device, the edge termination trench extends mainly in parallel to edges of the semiconductor substrate structure and comprises diagonals or curvatures at corner regions of the semiconductor substrate structure.

Opposite to designing the layout of the edge termination trench according to the layout of the cell region, it can be designed according to the layout of other parameters as well, like substrate structure edges. This may include the border or cutting line of the device or substrate structure (when splitting the die), an electrical design border or any other border which has an influence on the necessity of the edge termination region.

In an embodiment of the semiconductor device, an inner layout line of the edge termination trench has a diagonal straight with an angle between 35° and 55° (e.g. 45°, including 10°, 5° or 1° deviation) to the neighboring straight, whereas the diagonal straight faces the corner of the cell region.

This may lead to the possibility that the mesa width may differ not so much, but having a simple geometrical form for the edge termination trench (here: having the diagonals in the corners), for example.

Figure 5A:
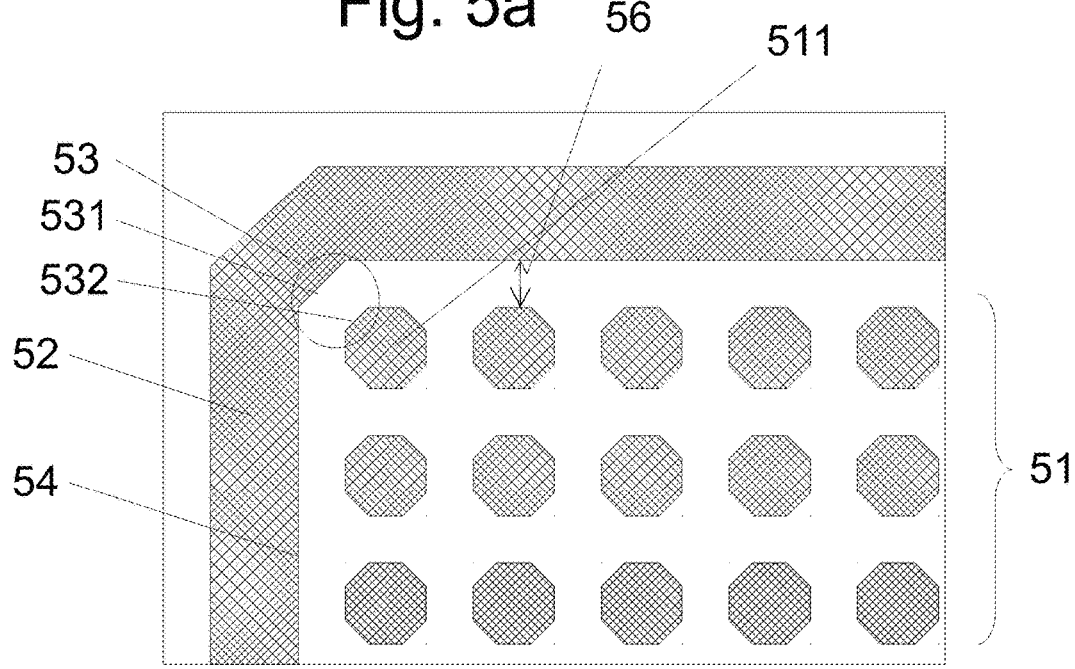
FIG. 5a shows a top view of a corner section of a semiconductor device with a diagonal of the edge termination trench.

FIG. 5a shows an inner layout line 54 of the strip-shaped edge termination trench 52 adapted in the corner part 53 of the cell field 51. If there would be no adaption, the corner of the inner layout line would be rectangular, thus having a larger mesa width between the corner and the corner needle-shaped cell trench 511. To reduce this width a diagonal is designed on the layout line 54 in the corner region 53. For example, for a needle-shaped trench having an octagonal layout, a 45° angle for the diagonal to assure the same distance (mesa width) 56 at most points. This may happen, if the diagonal 531 is parallel to the straight 532 (if available) of the shape of the corner needle-shaped trench 511, which faces the corner 53, for example. If the needle-shaped trench has another layout, like e.g. a hexagonal, the diagonal 531 may be layout parallel as well, e.g. in an angle of 60°. If the layout of the needle-shaped trench 511 is round, a round/curved design for the corner part 53 of the inner layout line 54 may be suitable. The round form offers the possibility to a substantially perfect equidistance of the mesa width 56 in the corner 53 (aside from production tolerances), for example. The processes itself may also lead to more or less pronounced rounding of all corners, for example.

In an embodiment of the semiconductor device, an inner layout line of the edge termination trench which faces the cell region is designed in a way that a distance from each point of the inner layout line to a nearest point of the outline of a nearest cell trench deviates by less than 20% from an average distance between the inner layout line of the edge termination trench and the nearest point of the outline of the nearest cell trench.

Other possible deviations are less than 10% or 5%. Other possible deviations may be used to omit round lines and have angles instead. E.g. to have an equal distance of a strip-shaped trench to an octagonal needle-shaped trench, the inner layout line of the strip-shaped trench would be round/curved everywhere a corner point of the octagon is the closest point. To omit the curve, it may be possible to follow the shape of the octagon for the inner layout line.

Figure 5B:
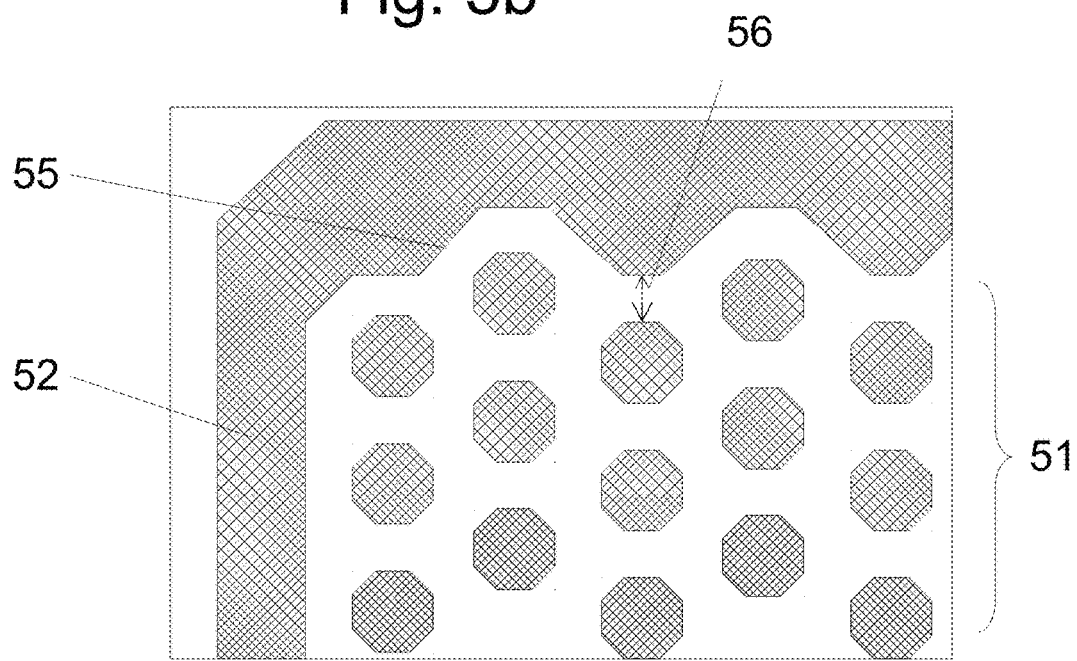
FIG. 5b shows a top view of a corner section of a semiconductor device with a grid adapted edge termination trench.

FIG. 5b shows an inner layout line 55 of the strip-shaped edge termination trench 52 adapted to the shape of the outline of the needle-shaped trenches of the cell region 51, while their trenches are positioned shifted to each other vertical row or in other words, in a rhombus or octagonal grid. The inner layout line 55 follows the cell trench rows which are shifted to the inner of the cell region to a distance 56, which is substantially equal to a normal mesa width (=distance or average mesa width) between two cell trenches. Maybe it is not possible to design a line 55 in a way, that each point on it has the same distance to the closest point of the outline of the nearest cell, which ideally would provide the same mesa width everywhere. This possible inability might be due to production capabilities (etching very fine structures) or geometrical impossibilities, for example. E.g. according to the figure, it would be possible to have triangle shaped spikes reaching from the left part of the edge termination trench 52 into the gaps between the adjacent cell trenches.

In an embodiment of the semiconductor device, the shape of the field plates within the plurality of needle-shaped cell trenches in a cross section parallel to the surface is substantially round, hexagonal, octagonal or square.

The mentioned shape may have a 10% or 5% deviation in relation to its mean diameter of the shape or the round form. Alternatively a deviation of 0.5 µm, 0.2 µm, 0.02 µm may apply.

In an embodiment of the semiconductor device, the plurality of trenches is aligned in a rectangular or shifted or hexagonal grid or in a grid according to the shape of the field plates.

The plurality of trenches may comprise the plurality of needle-shaped cell trenches only or comprise at least parts of the edge termination region, especially edge termination trenches of a needle-shaped form. The latter may be aligned in the same grid/pattern like the cell trenches. Additional trenches may further be part of the edge termination region, e.g. a strip-shaped outermost surrounding trench.

Shifted or other arrangements of the plurality of needle-shaped trenches may have less deviation in their lateral distances in between (mesa width). This may be also dependent on the shape in top view of the needle-shaped trenches.

According to an embodiment a semiconductor device comprises a semiconductor substrate structure comprising a cell region and an edge termination region surrounding the cell region and a row of needle-shaped trenches within the edge termination region surrounding the cell region at the surface of the semiconductor substrate structure. A plurality of field plate structures extend into the needle-shaped trenches of the row of needle-shaped trenches. The field plate structures are insulated from the semiconductor substrate structure within the trenches by an insulating material structure extending throughout the row of needle-shaped trenches.

Figure 6A:
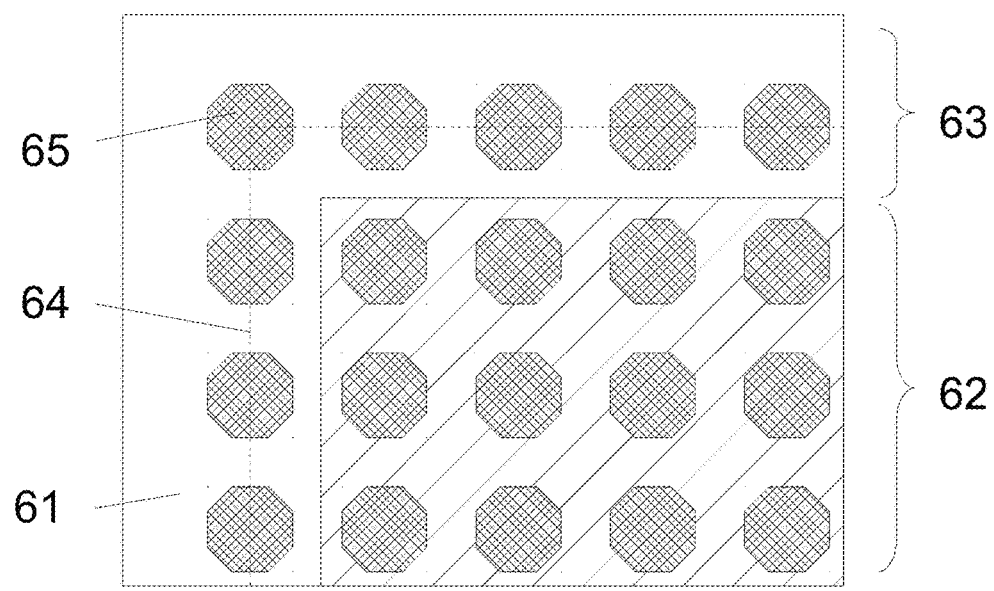
FIG. 6a shows a top view of a corner section of a semiconductor device with a row of needle-shaped trenches in the edge termination region.

FIG. 6a shows a corner part of a semiconductor device having a semiconductor substrate structure 61, having a cell region 62 (hatched) and an edge termination region 63, needle-shaped trenches 65 (exemplary for all others) and a row of needle-shaped trenches 64 combining the needle-shaped edge termination trenches to an edge termination structure, which may have the same or similar features like a strip-shaped trench. A row of needle-shaped trenches may be easier to manufacture in some cases.

The row of needle-shaped trenches within the edge termination region may be inactive needle-shaped trenches as mentioned above.

If the edge termination trench comprises needle-shaped trenches the production process may be simplified because processing steps may be the same or deviations between the trenches are less than with mixed-shape trenches. Needle-shaped trenches may have better carrier charge compensation abilities by being able to reduce the insulation thickness compared to e.g. a strip-shaped trench.

For example, a semiconductor structure within a semiconductor device having a semiconductor substrate structure, at least one surface, trenches, which extend orthogonal from the surface into the substrate structure and a field plate, which extends inside at least one of the trenches and the field plate is insulated from the semiconductor substrate structure by an insulation layer, comprising at least one cell or an array of cells, whereas at least one cell comprises a cell trench and an edge termination trench structure positioned outside/around the cell or array of cells, whereas the edge termination trench structure comprises needle-shaped trenches extending from the surface into the substrate structure.

In an embodiment of the semiconductor device, a shortest lateral distance between an outer of two adjacent needle-shaped trenches is the same within the cell region as well as within the edge termination region, including a deviation of less than 10% in relation to the diameter of a trench. The deviation may also be less than 5% or 1% or absolute 0.5 µm, 0.2 µm, 0.1 µm, or 0.01 µm.

If the distance between the trenches is the same and the diameter of the trenches is the same, simplifications during manufacturing may occur.

In an embodiment of the semiconductor device, an insulation layer of the needle-shaped trenches of the edge termination region is thicker than the insulation layer of the needle-shaped trenches of the cell region.

This may also affect the diameter of the trenches. If the insulation layer of a first trench is thicker than the one of a second trench, then the first trench either has a thinner field plate structure inside or its diameter is bigger, for example.

In an aspect, the thickness of the insulation layers increases from an inner to an outermost needle-shaped trench within the edge termination region.

In an embodiment of the semiconductor device, neighboring needle-shaped trenches of the row of needle-shaped trenches are merged.

The needle-shaped edge termination trenches may overlap. This may be due to extending diameters of neighboring needle-shaped trenches on the row of trenches. Another possibility is to have the needle-shaped trenches in the row set with a closer distance to each other, so overlapping occurs.

Figure 6B:
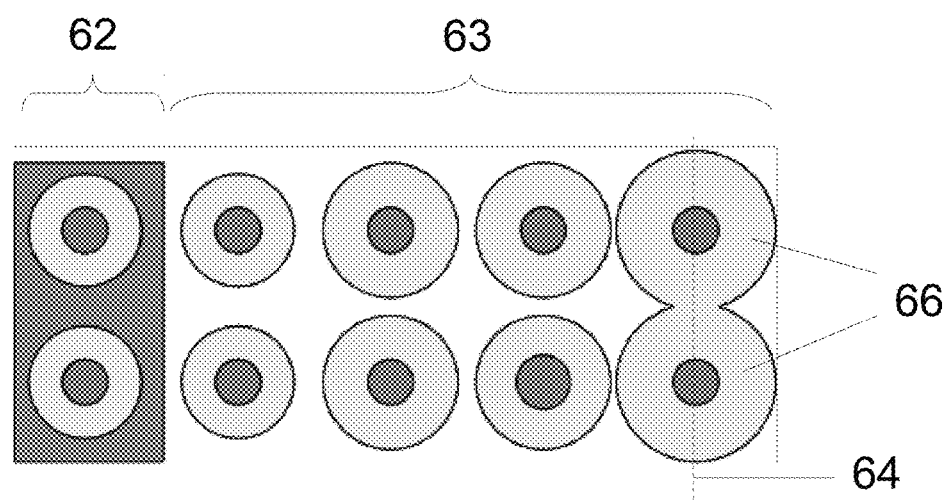
FIG. 6b shows a top view of an edge termination structure with different thicknesses of the field oxide.

FIG. 6b shows a cell region 62 and an edge termination region 63 having 4 rows 64 of needle-shaped trenches. The insulation layer and the diameter increases to the outside (right). Such an increase may be in steps or continuously. The outermost row 64 of needle-INF shaped trenches 66 is merged and can be described as one single trench, similar to a strip-shaped trench. The latter may have only one field plate, while the merged needle-shaped trenches comprise several field plate structures, which are insulated from each other and the substrate structure within the row of needle-shaped trenches by an insulating material structure extending throughout the row of needle-shaped trenches of the edge termination region 63.

More details and aspects are mentioned in connection with embodiments described above or below. The embodiments shown in FIG. 6a and/or 6b may comprise one or more optional additional features corresponding to one or more aspects mentioned in connection with the proposed concept or one or more embodiments described above or below (e.g. FIG. 1).

According to an embodiment a semiconductor device comprises a semiconductor substrate structure comprising a cell region and an edge termination region surrounding the cell region, at least one cell trench within the cell region reaching from a surface of the semiconductor substrate structure into the substrate structure, at least one edge termination trench within the edge termination region surrounding the cell region at the surface of the semiconductor substrate structure and an insulation layer within the trenches. The insulation layer within the at least one cell trench is thinner than the insulation layer within the at least one edge termination trench.

In this way means of production might be easier when producing the trench structure.

Figure 7A:
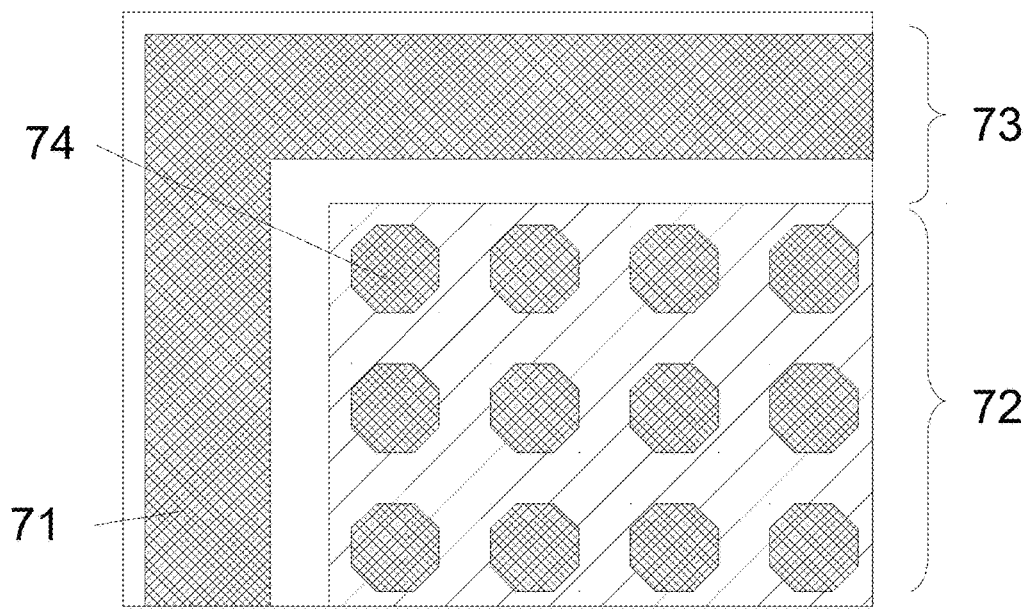
FIG. 7a shows a top view of a corner section of a semiconductor device with a thicker insulation layer in the edge termination trench.

FIG. 7a shows a cell region 72 having at least one needle-shaped trench 74 and an edge termination region 73 having an edge termination trench 71 which is thicker or has a thicker insulation layer than the needle-shaped cell trench.

A thicker insulation layer in the edge termination region may improve the prevention of an undesired breakthrough by reducing the field strength peaks at the edge termination trench.

In an embodiment of the semiconductor device, a field plate structures extend inside at least an inner edge termination trench and an outer-most edge termination trench and the field plates are insulated from the semiconductor substrate structure by insulation layers within the edge termination trenches and a thickness of the field plate structures decreases from the inner to the outermost edge termination trench.

Figure 7B:
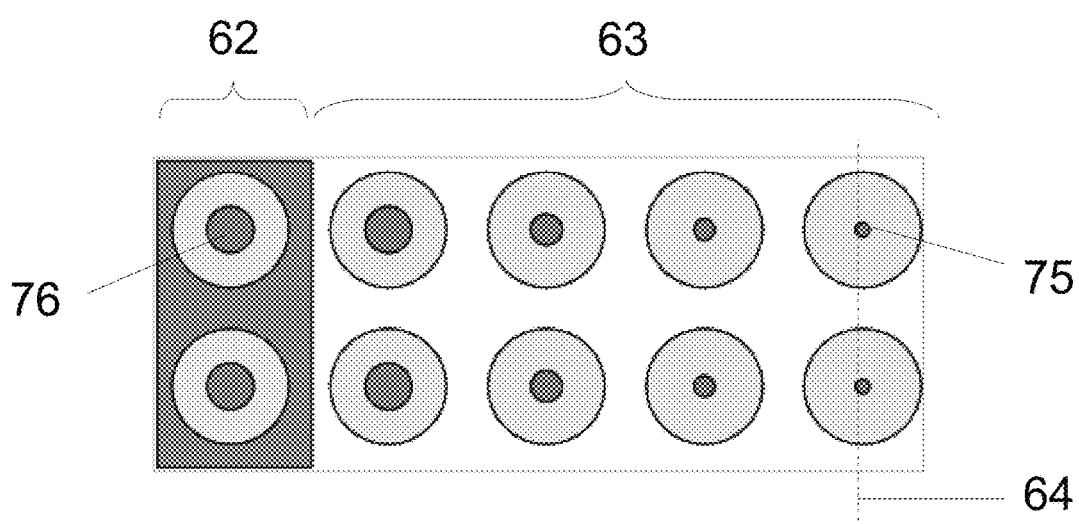
FIG. 7b shows a top view of an edge termination structure with different thicknesses of the field plate structures.

FIG. 7b shows a cell region 62 and an edge termination region 63 having 4 rows 64 of needle-shaped trenches. The insulation layer and the diameter increases to the outside (right). Opposite to FIG. 6b here the increase comes from the decrease of the diameter/thickness of the field plate structure, while the diameter of the trenches itself may stay constant.

As well, the thickness of the field plate structures may decrease in steps from the inside 76 to the outermost 75 or continuously.

If the effect of the field plates (e.g. charge carrier compensation) is not necessary at the edge, then the insulation layer may be increased instead, for example.

In an aspect the edge termination trench structure may be strip—71 or needle-shaped, e.g. a row of needle-shaped trenches 64.

More details and aspects are mentioned in connection with embodiments described above or below. The embodiments shown in FIG. 7a and/or 7b may comprise one or more optional additional features corresponding to one or more aspects mentioned in connection with the proposed concept or one or more embodiments described above or below (e.g. FIG. 1).

FIG. 8 shows in an aspect a method 80 for forming a semiconductor device comprising a semiconductor substrate structure comprising a cell region and an edge termination region surrounding the cell region, a plurality of needle-shaped cell trenches within the cell region reaching from a surface of the semiconductor substrate structure into the substrate structure and an edge termination trench within the edge termination region surrounding the cell region at the surface of the semiconductor substrate structure.

More details and aspects are mentioned in connection with embodiments described above or below. The embodiment shown in FIG. 8 may comprises one or more optional additional acts corresponding to one or more aspects mentioned in connection with the proposed concept or one or more embodiments described above or below (e.g. FIG. 1).

Some embodiments relate to an edge termination structure having a thick field oxide for Power-MOSFETs with compensation by field-plates within needle-shaped trenches and cell layouts.

If some of the described semiconductor devices, which may be (Power-) MOSFETs, are provided for higher breakdown voltages, deeper trenches and thicker oxides around the field plates may be required. This would increase the stress within such structures and may lead to an undesired wafer bow during manufacturing. In order to provide the components for higher breakdown voltages nevertheless, the blocking capability can also be increased by a compensation structure positioned below a lower doped additional drift zone. Such a partially compensated structure may require complicated edge structures, if the vertical voltage drop within the component would be further increased, although the doping at the surface is still very high. As a measure depletable p-areas below the edge termination trench to increase the blocking capability may be realized or tapping the potential at the upper pn-junction for the field plate of the next trench, thereby the potential can gradually be increased to the outside, which would not be possible with field plates connected to source, because the field oxide would be too thin for the emerging potential difference, for example.

It may be taken into account for a realizable edge structure with a surrounding edge termination trench that simulations show that in comparison to the strip-shaped cell a needle-shaped cell may requires a lower field oxide thickness for the same blocking capability, with a higher doping of the mesa region and otherwise identical device geometry (trench depth, mesa width) simultaneously.

For a 100 V needle trench cell, for example a thickness of the field oxide between 300 nm and 600 nm may be suitable, at a mesa width between 500 nm and 1 µm and a doping between 4e15 and 1e17. The field oxide for the strip-shaped cell can be designed, that it provides the blocking capability with the given mesa width and doping. The given doping may be allowed for all investigated field oxide thicknesses. A thickness of the field oxide (which is to be chosen) between 500 nm and 1 µm may be derived, for example.

For example, a proposed semiconductor device may have needle trenches in the cell field, a closed ring surrounding the cell field acting as termination structure and a larger insulator thickness in the surrounding trench as in the needle trenches of the cell field. Further, all trenches may have (at least) a field-plate electrode arranged in the trenches.

In an aspect, an edge structure for a compensation component is proposed with compensation by means of field plates in needle-shaped trenches in an active cell array, which comprises one or more of the following features:

the edge may be formed by a continuous edge termination trench which surrounds the cell array;

the thickness of the field oxide in the edge termination trench may be bigger than the thickness of the field oxide within the cell array; and trench width in the edge termination region may be greater than the trench width within the cell.

Further aspects may be one or more out of the following selection:

the edge termination trench may be deeper than cell trenches;

the edge termination trench may have an angular/square shape;

the edge termination trench may be implemented diagonally in the corner region, to achieve the same width of the peripheral mesa along the diagonal identical along the sides;

the edge termination trench in the corner may comprise a smaller width at the diagonal of the peripheral mesa than along the sides;

a plurality of circumferential edge termination trenches may be implemented;

the depth of edge termination and cell array trenches may be identical;

tell array and peripheral regions may have the same mesa width;

the edge termination trenches may be connected to source potential, but e.g. maybe also connected to adjacent p-type regions and therefore may be at a higher potential;

no circular trenches, but needle-shaped trenches with larger thicknesses of field oxides which may extend may be used. The oxides can be successively extended further to the outside and may also overlap and thus form a circumferential trench;

the field electrode may be thinner to the outside. Due to the smaller radius of curvature, the field strength in the oxide may increase and—similar to a thicker field oxide—a higher voltage may be absorbed;

cells may be positioned on an orthogonal grid and may be surrounded by a surrounding edge termination trench with a thick field oxide, including an according large trench width;

different layout ideas may exist with to increase the doping by decreasing the diagonal between the compensation trenches. Such cell designs "out of alignment" may be used; and different shapes of field plate trenches (round, hexagonal, octagonal or square) may be used.

Some embodiments relate to a power semiconductor device. In other words, a semiconductor device according to the described concept or one or more embodiments described above may comprise a blocking voltage of more than 100 V (e.g. between 100 V and 10000 V or more than 500 V, more than 1000 V or more than 4000 V).

Example embodiments may further provide a computer program having a program code for performing one of the above methods, when the computer program is executed on a computer or processor. A person of skill in the art would readily recognize that steps of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th." A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device comprising:
   a semiconductor substrate structure comprising a cell region and an edge termination region;
   a plurality of cell trenches within the cell region extending from a surface of the semiconductor substrate structure into the semiconductor substrate structure, the plurality of cell trenches each comprising an insulation layer; and
   a plurality of edge termination trenches within the edge termination region extending from a surface of the semiconductor substrate structure into the semiconductor substrate structure, the plurality of edge termination trenches each comprising an insulation layer,
   wherein the edge termination trenches and the cell trenches comprise a same type of needle shaped trenches, and
   wherein the semiconductor substrate structure comprises a doping concentration that increases with a distance from the surface of the semiconductor substrate structure.

2. The semiconductor device of claim 1, wherein the edge termination region surrounds the cell region in a plan view.

3. The semiconductor device of claim 1, wherein an outermost row of cell trenches has the same insulation layer thickness as an innermost row of edge termination trenches.

4. The semiconductor device of claim 1, wherein the insulation layer of an innermost row of edge termination trenches is thinner than the insulation layer of an outermost row of edge termination trenches.

5. The semiconductor device of claim 1, wherein the insulation layer of an intermediate row of edge termination trenches is thicker than the insulation layer of an innermost row of edge termination trenches, and thinner than the insulation layer of an outermost row of edge termination trenches.

6. The semiconductor device of claim 1, wherein the insulation layers of an outermost row of edge termination trenches are merged.

7. The semiconductor device of claim 1, wherein the insulation layer of the plurality of cell trenches and the insulation layer of the plurality of edge termination trenches comprise a round layout in a plan view.

8. The semiconductor device of claim 1, wherein the plurality of cell trenches and the plurality of edge termination trenches comprise a field plate insulated from the semiconductor substrate structure by the respective insulating layers.

9. The semiconductor device of claim 8, wherein an area of the field plate associated with one of the plurality of cell trenches and an area of the field plate associated with one of the plurality of edge termination trenches are same in a plan view.

10. The semiconductor device of claim 1, wherein the insulation layer of at least one of the plurality of cell trenches is thinner than the insulation layer of at least one of the plurality of edge termination trenches.

11. The semiconductor device according to claim 1, the plurality of cell trenches are active needle-shaped cell trenches, each of the active needle-shaped cell trenches comprising a gate structure for controlling an adjacent channel of a field effect transistor structure.

12. The semiconductor device according to claim 1, wherein each of the plurality of cell trenches comprises a maximal lateral extension in one direction of less than 2 times a minimal lateral extension in another direction.

13. The semiconductor device according to claim 1, wherein a lateral distance between an outermost edge termination trench and an active cell trench closest to the outermost edge termination trench is larger than an extension of the outermost edge termination trench from the surface of the semiconductor substrate structure into the semiconductor substrate structure.

14. The semiconductor device according to claim 1, wherein each of the plurality of edge termination trenches comprises one of a rectangular layout, a square layout, a round layout, a curved layout, a hexagonal layout or an octagonal layout.

15. The semiconductor device according to claim 1, wherein edge termination trenches of the plurality of edge termination trenches extend mainly in parallel to edges of the semiconductor substrate structure and comprise diagonals or curvatures at corner regions of the semiconductor substrate structure.

16. The semiconductor device according to claim 1, wherein an inner layout line of each edge termination trench has a diagonal straight with an angle between 35° and 55° to a neighboring straight, whereas the diagonal straight faces a corner of the cell region.

17. The semiconductor device according to claim 1, wherein an inner layout line of the edge termination trench which faces the cell region is designed in a way that a distance from each point of the inner layout line to a nearest point of an outline of a nearest cell trench deviates by less than 20% from an average distance between the inner layout line of the edge termination trench and the nearest point of the outline of the nearest cell trench.

18. The semiconductor device according to claim 1, wherein the edge termination region comprises an additional implantation relative to the cell region.

19. The semiconductor device according to claim 1, wherein the plurality of cell trenches is aligned in a rectangular, shifted or hexagonal grid.

20. The semiconductor device according to claim 1, wherein a field plate structure extends inside each trench of the plurality of cell trenches and the plurality of edge termination trenches and the field plate structures are insulated from the semiconductor substrate structure within the trenches by the respective insulation layers, and wherein the insulation layer within the plurality of cell trenches is thinner than the insulation layer within the plurality of edge termination trenches.

\* \* \* \* \*